(12) United States Patent
Quek et al.

(10) Patent No.: US 6,803,314 B2
(45) Date of Patent: Oct. 12, 2004

(54) DOUBLE-LAYERED LOW DIELECTRIC CONSTANT DIELECTRIC DUAL DAMASCENE METHOD

(75) Inventors: Shyue Fong Quek, Petaling Jaya (MY); Ting Cheong Ang, Singapore (SG); Yee Chong Wong, Singapore (SG); Sang Yee Long, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 37 days.

(21) Appl. No.: 09/845,480

(22) Filed: Apr. 30, 2001

(65) Prior Publication Data

US 2002/0160604 A1 Oct. 31, 2002

(51) Int. Cl.$^7$ ................ H01L 21/302; H01L 21/311
(52) U.S. Cl. ................ 438/689; 438/694; 438/700; 438/703
(58) Field of Search ................ 438/689, 694, 438/700, 703

(56) References Cited

U.S. PATENT DOCUMENTS

| | | | |
|---|---|---|---|
| 4,789,648 A | * 12/1988 | Chow et al. | 438/633 |
| 5,565,384 A | * 10/1996 | Havemann | 438/702 |
| 5,635,423 A | 6/1997 | Huang et al. | 437/195 |
| 5,651,855 A | * 7/1997 | Dennison et al. | 438/628 |
| 5,741,626 A | 4/1998 | Jain et al. | 430/314 |
| 5,869,219 A | * 2/1999 | Kuo et al. | 430/270.1 |
| 5,877,076 A | 3/1999 | Dai | 438/597 |
| 5,935,762 A | 8/1999 | Dai et al. | 430/312 |
| 5,955,781 A | * 9/1999 | Joshi et al. | 257/712 |
| 6,004,883 A | 12/1999 | Yu et al. | 438/706 |
| 6,020,269 A | * 2/2000 | Wang et al. | 438/717 |
| 6,025,259 A | 2/2000 | Yu et al. | 438/618 |
| 6,037,664 A | * 3/2000 | Zhao et al. | 257/758 |
| 6,071,809 A | 6/2000 | Zhao | 438/634 |
| 6,083,822 A | 7/2000 | Lee | 438/624 |
| 6,146,986 A | * 11/2000 | Wagganer | 438/618 |
| 6,159,661 A | * 12/2000 | Huang et al. | 430/313 |
| 6,420,561 B1 | * 7/2002 | Kudo | 438/633 |

FOREIGN PATENT DOCUMENTS

JP          10-112503 A    * 10/1996    ......... H01L/21/768

OTHER PUBLICATIONS

Toshiaki, Manufacture of Semiconductor Device, Oct. 3, 1996, Computer translation of JP 10–112503, 6 pages.*
Chang et al., *ULSI Technology*, The McGraw Hill Companies, Inc., NY, NY, c.1996, pp. 444–445.

* cited by examiner

*Primary Examiner*—Nadine G. Norton
*Assistant Examiner*—Lynette T. Umez-Eroinin
(74) *Attorney, Agent, or Firm*—George O. Saile; Rosemary L.S. Pike

(57) ABSTRACT

A double layered low dielectric constant material dual damascene metallization process is described. Metal lines are provided covered by an insulating layer overlying a semiconductor substrate. A first organic dielectric layer is deposited overlying the insulating layer. A second inorganic dielectric layer is deposited overlying the first dielectric layer. In a first method, a via pattern is etched into the second dielectric layer. The via pattern is etched into the first dielectric layer using the patterned second dielectric layer as a mask. Thereafter, a trench pattern is etched into the second inorganic dielectric layer to complete dual damascene openings. In a second method, a trench pattern is etched into the second dielectric layer. Thereafter, a via pattern is etched through the second inorganic dielectric layer and the first organic dielectric layer to complete dual damascene openings. In a third method, a via pattern is etched into the second dielectric layer. Then, simultaneously, the via pattern is etched into the first dielectric layer and a trench pattern is etched into the second inorganic dielectric layer to complete dual damascene openings in the fabrication of an integrated circuit device.

10 Claims, 10 Drawing Sheets

DOUBLE-LAYERED LOW DIELECTRIC CONSTANT DIELECTRIC DUAL DAMASCENE METHOD

RELATED PATENT APPLICATION

U.S. patent application Ser. No. 09726657 (CS-00-024) to Q. S. Fong et al., filed Nov. 30, 2000, now U.S. Pat. No. 6,406,994.

BACKGROUND OF THE INVENTION (1) Field of the Invention

The invention relates to a method of metallization in the fabrication of integrated circuits, and more particularly, to a method of dual damascene metallization using low dielectric constant materials in the manufacture of integrated circuits.

(2) Description of the Prior Art

The damascene or dual damascene process has become a future trend in integrated circuit manufacturing, especially in the copper metallization process. These processes are discussed in *ULSI Technology*, by Chang and Sze, The McGraw Hill Companies, Inc., NY, N.Y., c. 1996, pp. 444–445. Low dielectric constant materials have been proposed as the dielectric materials in order to reduce capacitance. In the conventional damascene scheme, one or more etch stop and/or barrier layers comprising high dielectric constant materials, such as silicon nitride, are required. This defeats the purpose of the low dielectric constant materials. It is desired to find a process which does not require a high dielectric constant etch stop/barrier layer.

U.S. Pat. No. 6,004,883 to Yu et al shows a dual damascene method without an etch stop layer. U.S. Pat. No. 6,083,822 to Lee shows a dual damascene method using a thin silicon nitride etch stop layer. U.S. Pat. No. 6,025,259 to Yu et al discloses a dual damascene method with etch stop layers. U.S. Pat. No. 6,071,809 to Zhao shows a method using an etch stop layer. U.S. Pat. No. 5,635,423 to Huang et al teaches various methods of forming a dual damascene opening. An etch stop layer such as silicon nitride or polysilicon is used. U.S. Pat. Nos. 5,935,762 to Dai et al and 5,877,076 to Dai show a double mask self-aligned process using a silicon nitride etch stop layer. U.S. Pat. No. 5,741,626 to Jain et al discloses a dual damascene process using a tantalum nitride etch stop layer.

SUMMARY OF THE INVENTION

A principal object of the present invention is to provide an effective and very manufacturable method of metallization in the fabrication of integrated circuit devices.

Another object of the invention is to provide a dual damascene metallization process using low dielectric constant materials.

Yet another object of the invention is to provide a dual damascene metallization process using low dielectric constant materials without using a high dielectric constant etch stop material.

A further object of the invention is to provide a double layered low dielectric constant material dual damascene metallization process.

A still further object of the invention is to provide a double layered low dielectric constant material via first dual damascene metallization process.

Another object of the invention is to provide a double layered low dielectric constant material dual trench first damascene metallization process.

Yet another object of the invention is to provide a double layered low dielectric constant material self-aligned dual damascene metallization process.

In accordance with the objects of this invention a double layered low dielectric constant material dual damascene metallization process is achieved. Metal lines are provided covered by an insulating layer overlying a semiconductor substrate. A first organic dielectric layer is deposited overlying the insulating layer. A second inorganic dielectric layer is deposited overlying the first dielectric layer. In a first method, a via pattern is etched into the second dielectric layer. The via pattern is etched into the first dielectric layer using the patterned second dielectric layer as a mask. Thereafter, a trench pattern is etched into the second inorganic dielectric layer to complete dual damascene openings. In a second method, a trench pattern is etched into the second dielectric layer. Thereafter, a via pattern is etched through the second inorganic dielectric layer and the first organic dielectric layer to complete dual damascene openings. In a third method, a via pattern is etched into the second dielectric layer. Then, simultaneously, the via pattern is etched into the first dielectric layer and a trench pattern is etched into the second inorganic dielectric layer to complete dual damascene openings in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention provides a double-layered low dielectric constant material dual damascene process. A high dielectric constant material etch stop/barrier layer is not required in the process of the present invention. The present invention is described for three preferred embodiments. In the first preferred embodiment, a via first dual damascene process is described with reference to FIGS. 1–7. In the second preferred embodiment, a trench first dual damascene process is described with reference to FIGS. 8–13. In the third preferred embodiment, a self-aligned dual damascene process is described with reference to FIGS. 14–19.

Figure 1:
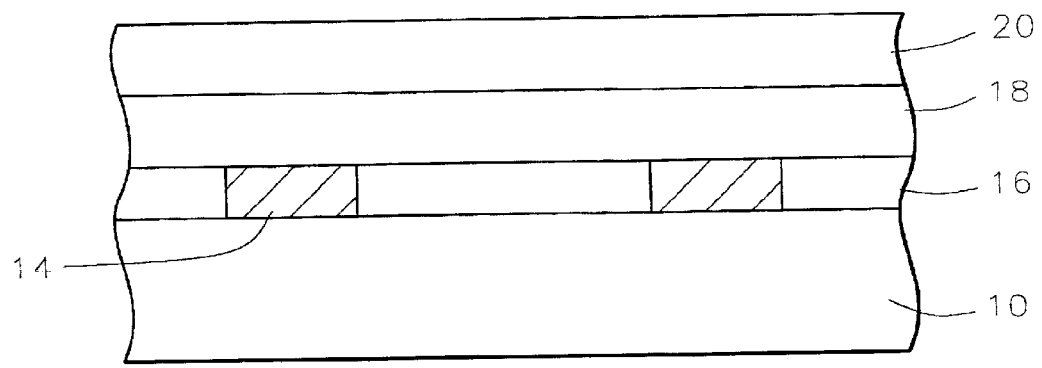
FIGS. 1 through 7 schematically illustrate in cross-sectional representation a first preferred embodiment of the dual damascene process of the present invention.

The first preferred embodiment, a via first dual damascene process, will now be described with reference to FIGS. 1–7. Referring now more particularly to FIG. 1, there is illustrated a portion of a partially completed integrated circuit device. There is shown a semiconductor substrate 10, preferably composed of monocrystalline silicon. Semiconductor devices structures, such as gate electrodes, source and drain regions, and metal interconnects, not shown, are formed in and on the semiconductor substrate and covered with an insulating layer. Interconnection lines, such as tungsten, copper or aluminum-copper lines 14, for example, are formed over the insulating layer and will contact some of the underlying semiconductor device structures through openings in the insulating layer, not shown.

Now, a passivation or barrier layer 16 is formed over the metal lines and planarized. Now, the key features of the present invention will be described. A first dielectric layer 18 is deposited over the barrier layer 16 to a thickness of between about 6000 and 20,000 Angstroms. This dielectric layer 18 comprises a low dielectric constant organic material, such as polyimides, hyrdrido organo siloxane polymer (HOSP) by AlliedSignal, Inc., SILK, a polyphenylene polymer by Dow Chemical, FLARE, a poly(arylene) ether by AlliedSignal, Inc., BCB, methylsilsesquioxane (MSQ), or any organic polymers. The dielectric constant should be less than about 3.5.

Next, a second dielectric layer 20 is deposited to a thickness of between about 6000 and 20,000 Angstroms. The second dielectric layer 20 comprises a low dielectric constant inorganic material, such as fluorinated silicate glass (FSG), carbon-doped FSG, nitrogen-doped FSG, CORAL, a carbon-doped oxide film by Novellus Systems, Inc., BLACK Diamond, a silicon oxide-based CVD low k film by Applied Materials, Trimethylsilane (Z3MS) by Air Products, XLK, a hydrogen silsesquioxane based material (by Dow Corning), and hydrogen silsesqioxane (HSQ). The dielectric constant should be less than about 3.5. Alternatively, the first dielectric layer could be inorganic and the second layer could be organic.

Figure 2:
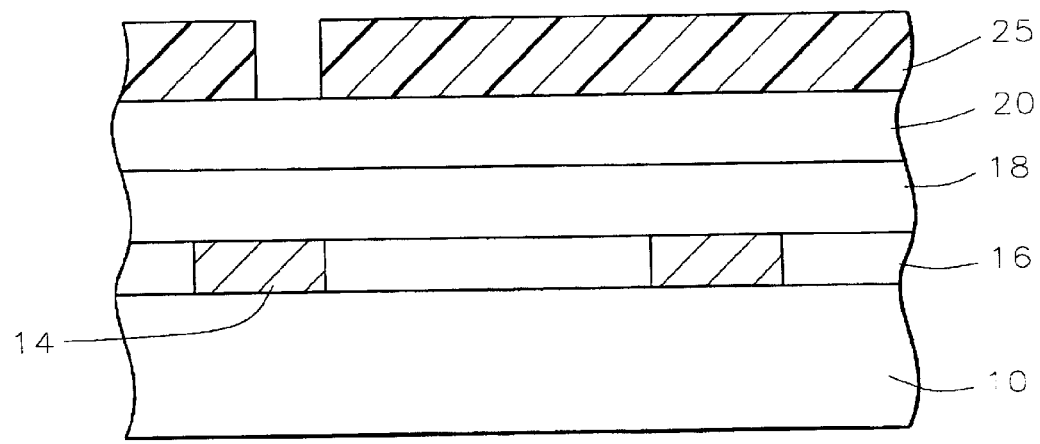
Figure 3:
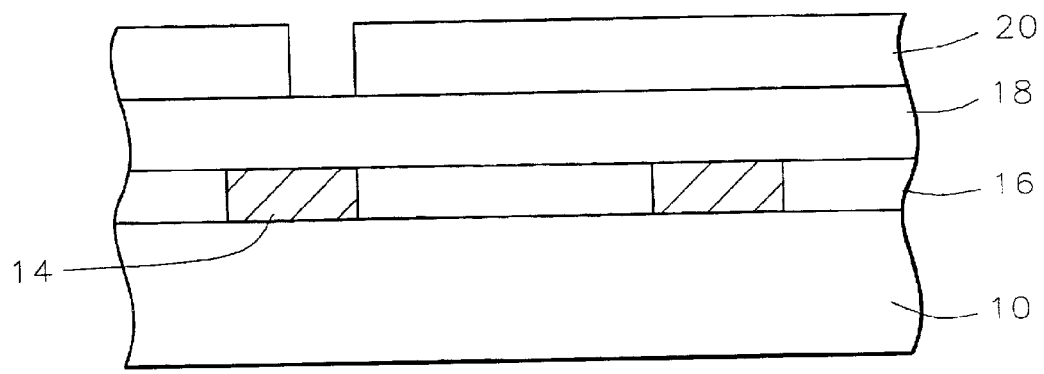

Referring now to FIG. 2, a photoresist layer is coated over the second dielectric layer 20 and patterned to form a photoresist mask 25 for the via pattern. The second dielectric layer 20 is etched where it is not covered by the photoresist mask 25 to form the via pattern, as shown in FIG. 3. The photoresist mask 25 is removed. If the second dielectric layer is an organic layer, a hard mask must be used instead of the photoresist mask since subsequent removal of the photoresist will damage the organic material as well.

Figure 4:
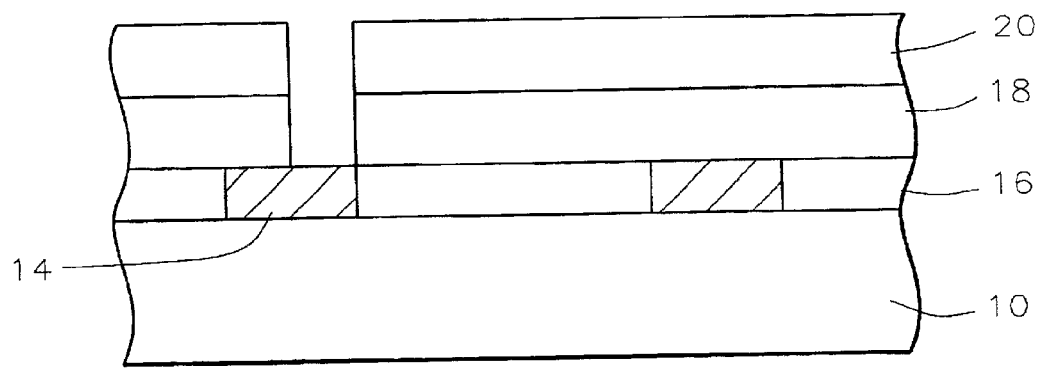

Now, the patterned second dielectric layer serves as a hard mask for etching the via pattern into the first dielectric layer 18, as shown in FIG. 4.

Figure 5:
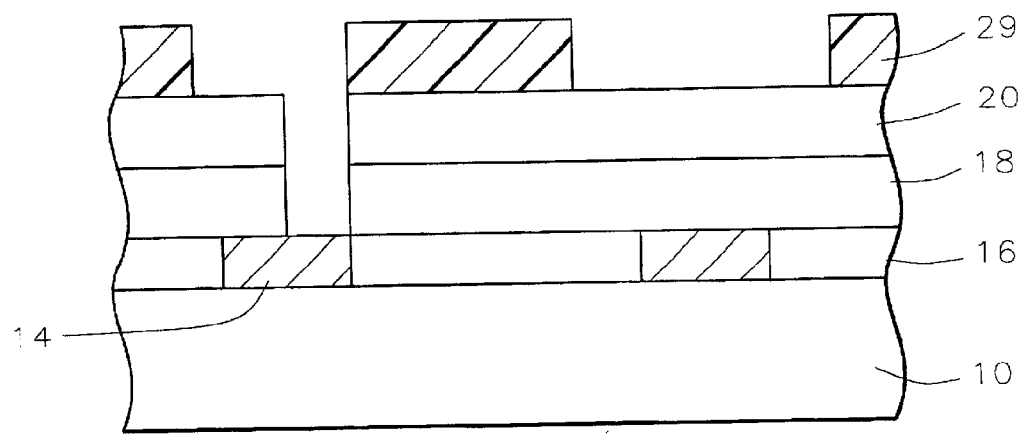

Referring now to FIG. 5, a second photoresist layer is coated over the second dielectric layer 20 and patterned to form the photoresist mask 29 having a trench pattern. Alternatively, a hard mask could be used instead of photoresist. The hard mask material must have-sufficient etch selectivity compared to the inorganic dielectric material deposited to prevent etching of the inorganic material during patterning.

Figure 6:
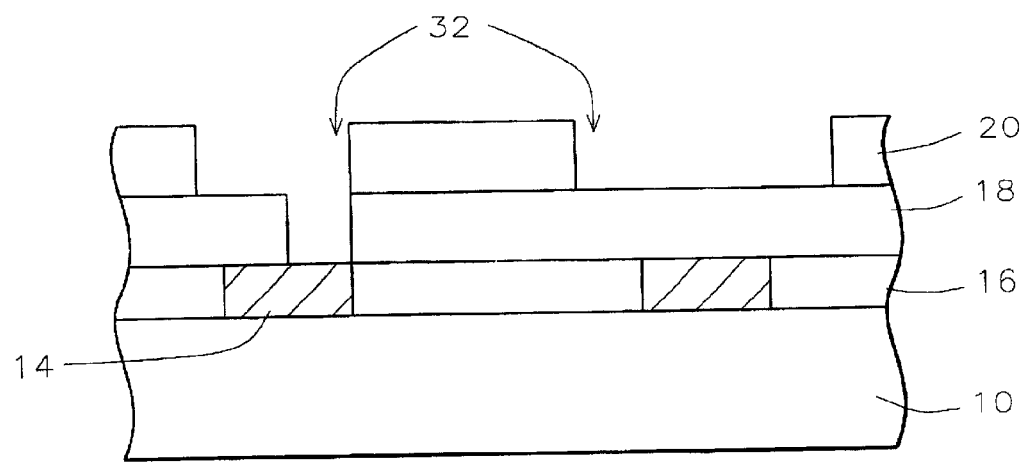

The trench pattern is etched into the second dielectric layer 20, as shown in FIG. 6. The etching recipe is chosen to etch the second dielectric layer with a high selectivity to the first dielectric material. In this way, the first dielectric material acts as an etch stop.

The photoresist mask 29 is removed, leaving the completed dual damascene openings 32, shown in FIG. 6. The process of the invention has formed the dual damascene openings using a double layer of low dielectric constant materials. No high dielectric constant material was used as an etch stop. Therefore, low capacitance is maintained.

Figure 7:
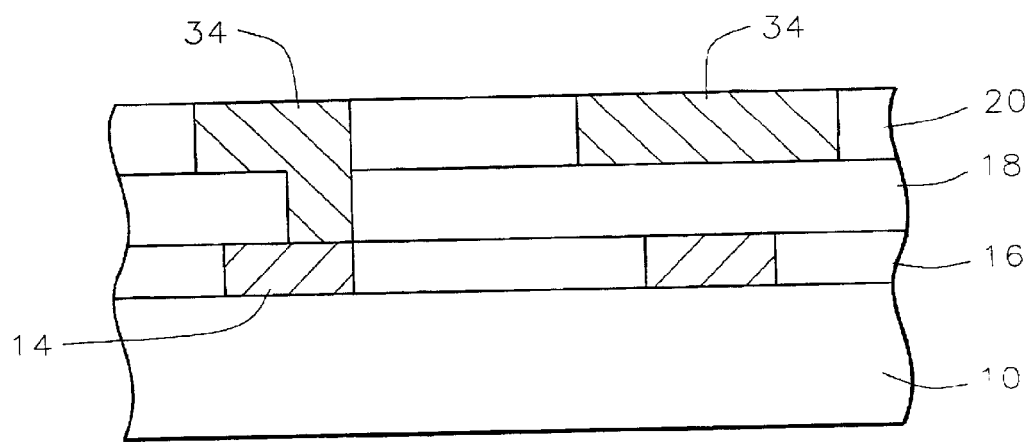

Processing continues as is conventional in the art to fill the damascene openings 32. For example, a barrier metal layer, not shown, is typically deposited over the third dielectric layer and within the openings. A metal layer, such as copper, is formed within the openings, such as by sputtering, electroless plating, or electroplating, for example. The excess metal may be planarized to complete the metal fill 34, as shown in FIG. 7.

Figure 8:
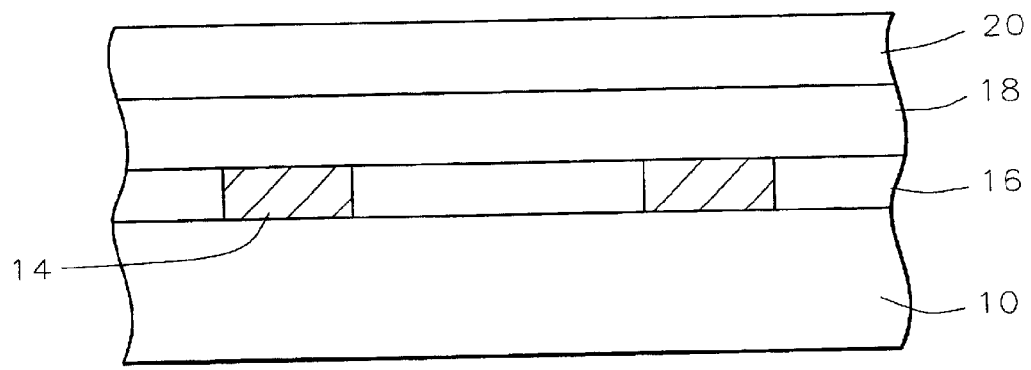
FIGS. 8 through 13 schematically illustrate in cross-sectional representation a second preferred embodiment of the dual damascene process of the present invention.

The second preferred embodiment, a trench first dual damascene process, will now be described with reference to FIGS. 8—13. Referring now more particularly to FIG. 8, there is illustrated a portion of a partially completed integrated circuit device. There is shown a semiconductor substrate 10, preferably composed of monocrystalline silicon. Semiconductor devices structures, such as gate electrodes, source and drain regions, and metal interconnects, not shown, are formed in and on the semiconductor substrate and covered with an insulating layer. Interconnection lines, such as tungsten, copper or aluminum-copper lines 14, for example, are formed over the insulating layer and will contact some of the underlying semiconductor device structures through openings in the insulating layer, not shown.

Now, a passivation or barrier layer 16 is formed over the metal lines and planarized. Now, the key features of the present invention will be described. A first dielectric layer 18 is deposited over the barrier layer 16 to a thickness of between about 6000 and 20,000 Angstroms. This dielectric layer 18 comprises a low dielectric constant organic material, such as polyimides, HOSP, SILK, FLARE, BCB, MSQ, or any organic polymers.

Next, a second low dielectric layer 20 is deposited to a thickness of between about 6000 and 20,000 Angstroms. The second dielectric layer 20 comprises a low dielectric constant inorganic material, such as fluorinated silicate glass (FSG), carbon-doped FSG, nitrogen-doped FSG, CORAL, BLACK Diamond, Z3MS, XLK, and HSQ. The dielectric constant should be less than about 3.5. Alternatively, the first dielectric layer could be inorganic and the second layer could be organic.

Figure 9:
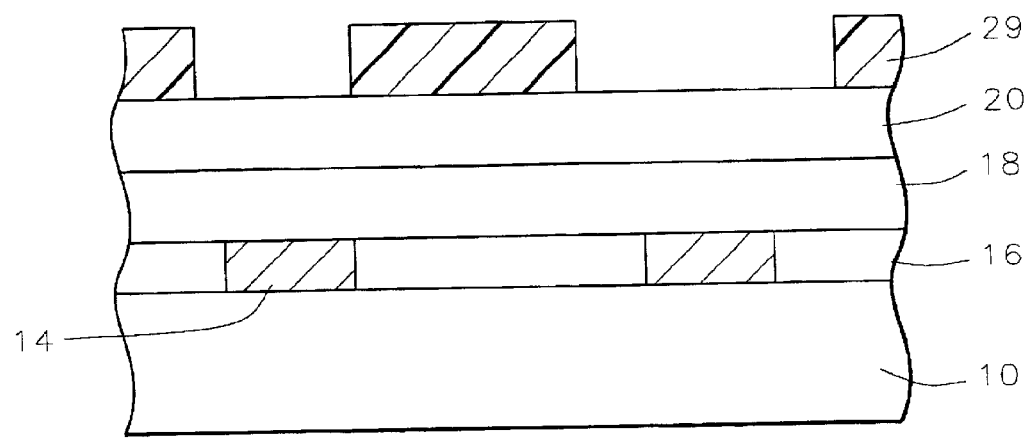
Figure 10:
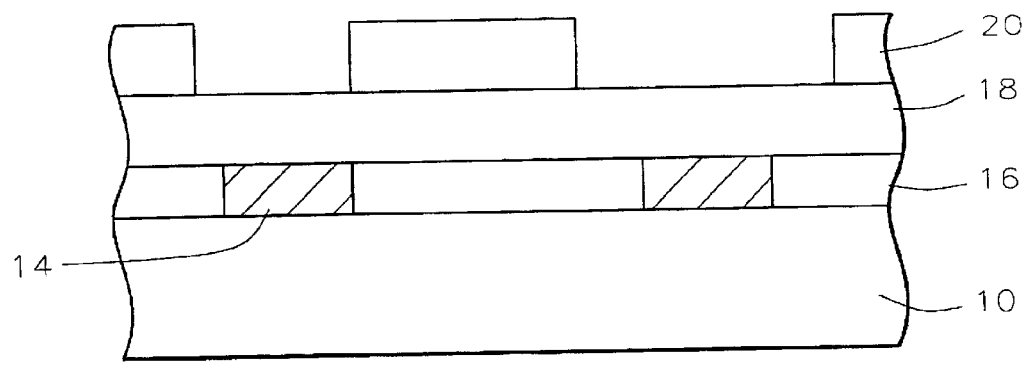

Referring now to FIG. 9, a photoresist layer is coated over the second dielectric layer 20 and patterned to form a photoresist mask 29 for the trench pattern. The second dielectric layer 20 is etched where it is not covered by the photoresist mask 29 to form the trench pattern, as shown in FIG. 10. The photoresist mask 29 is removed. If the second dielectric layer is an organic layer, a hard mask must be used instead of the photoresist mask since subsequent removal of the photoresist will damage the organic material as well.

Figure 11:
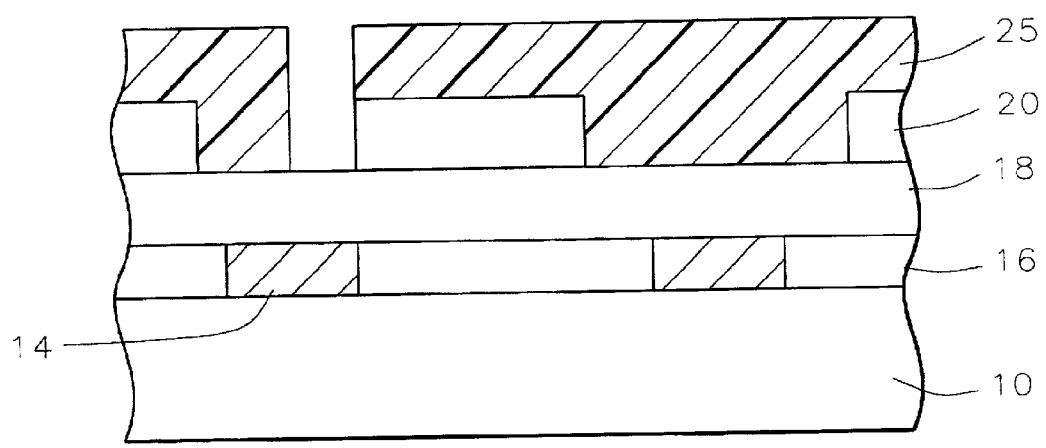

Referring now to FIG. 11, a second photoresist layer is coated over the patterned second dielectric layer 20 and patterned to form the photoresist mask 25 having a via pattern. Alternatively, a hard mask could be used instead of photoresist. The hard mask material must have sufficient etch selectivity compared to the inorganic dielectric material deposited to prevent etching of the inorganic material during patterning.

Figure 12:
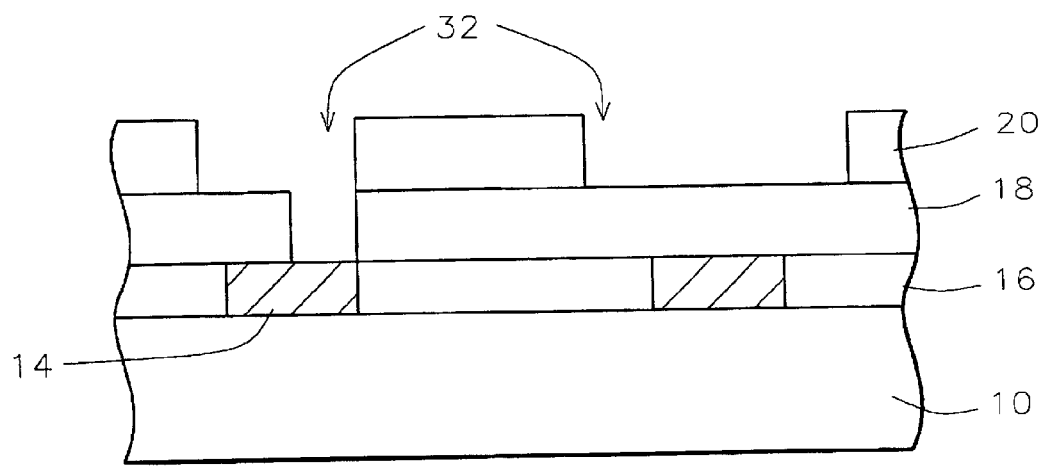

The via pattern is etched into the first dielectric layer 18, as shown in FIG. 12. The photoresist mask 25 is removed, leaving the completed dual damascene openings 32, shown in FIG. 12. The process of the invention has formed the dual damascene openings using a double layer of low dielectric constant materials. No high dielectric constant material was used as an etch stop. Therefore, low capacitance is maintained.

Figure 13:
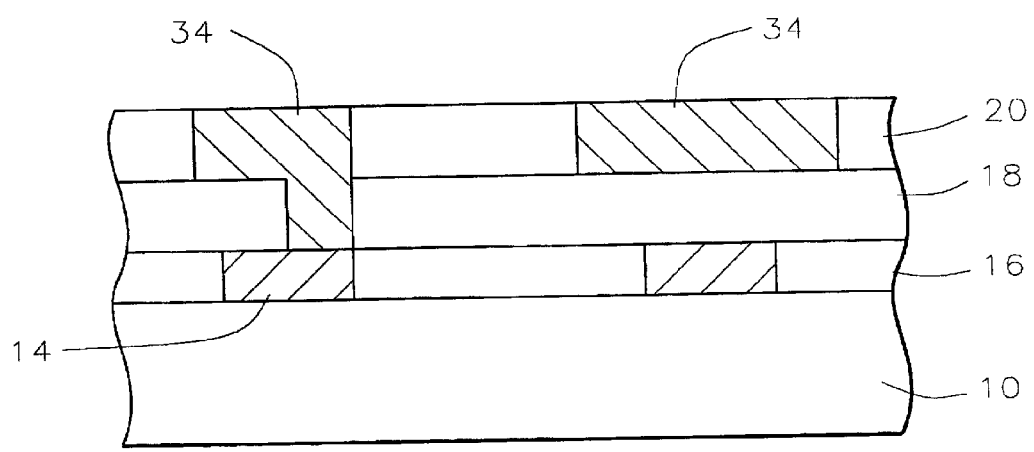

Processing continues as is conventional in the art to fill the damascene openings 32. For example, a barrier metal layer, not shown, is typically deposited over the third dielectric layer and within the openings. A metal layer, such as copper, is formed within the openings, such as by sputtering, electroless plating, or electroplating, for example. The excess metal may be planarized to complete the metal fill 34, as shown in FIG. 13.

Figure 14:
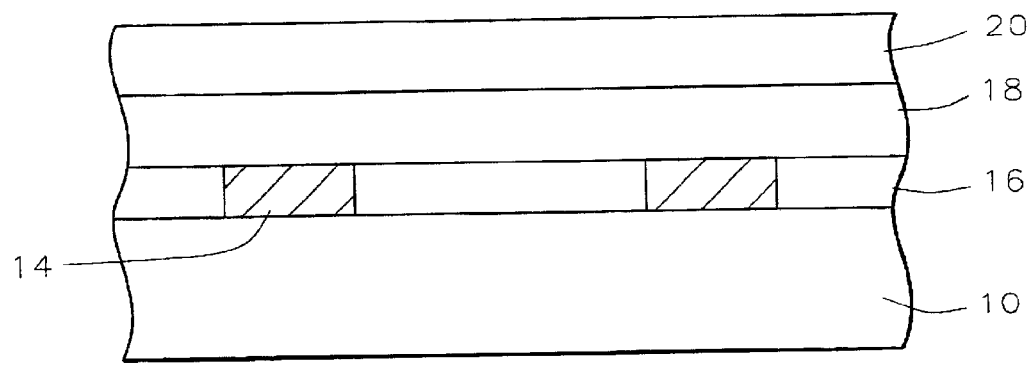
FIGS. 14 through 19 schematically illustrate in cross-sectional representation a third preferred embodiment of the dual damascene process of the present invention.

The third preferred embodiment, a self-aligned dual damascene process, will now be described with reference to FIGS. 14—19. Referring now more particularly to FIG. 14, there is illustrated a portion of a partially completed integrated circuit device. There is shown a semiconductor substrate 10, preferably composed of monocrystalline silicon. Semiconductor devices structures, such as gate electrodes, source and drain regions, and metal interconnects, not shown, are formed in and on the semiconductor substrate and covered with an insulating layer. Interconnection lines, such as tungsten, copper or aluminum-copper lines 14, for example, are formed over the insulating layer and will contact some of the underlying semiconductor device structures through openings in the insulating layer, not shown.

Now, a passivation or barrier layer 16 is formed over the metal lines and planarized. Now, the key features of the present invention will be described. A first dielectric layer 18 is deposited over the barrier layer 16 to a thickness of between about 6000 and 20,000 Angstroms. This dielectric layer 18 comprises a low dielectric constant organic material, such as polyimides, HOSP, SILK, FLARE, BCB, MSQ, or any organic polymers.

Next, a second low dielectric layer 20 is deposited to a thickness of between about 6000 and 20,000 Angstroms. The second dielectric layer 20 comprises a low dielectric constant inorganic material, such as fluorinated silicate glass (FSG), carbon-doped FSG, nitrogen-doped FSG, CORAL, BLACK Diamond, Z3MS, XLK, and HSQ. The dielectric constant should be less than about 3.5. Alternatively, the first dielectric layer could be inorganic and the second layer could be organic.

Figure 15:
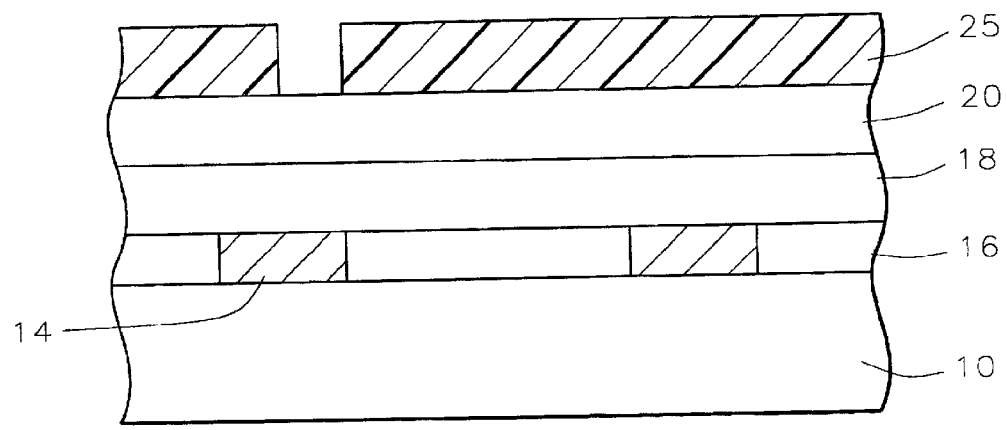
Figure 16:
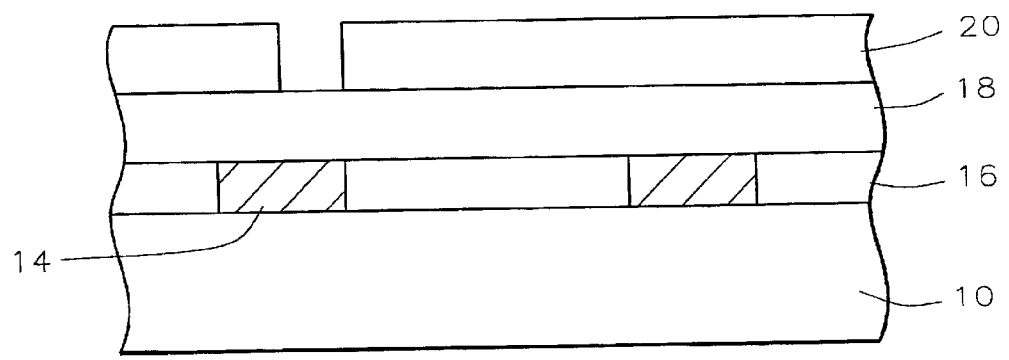

Referring now to FIG. 15, a photoresist layer is coated over the second dielectric layer 20 and patterned to form a photoresist mask 25 for the via pattern. The second dielectric layer 20 is etched where it is not covered by the photoresist mask 25 to form the via pattern, as shown in FIG. 16. The photoresist mask 25 is removed. If the second dielectric layer is an organic layer, a hard mask must be used instead of the photoresist mask since subsequent removal of the photoresist will damage the organic material as well.

Figure 17:
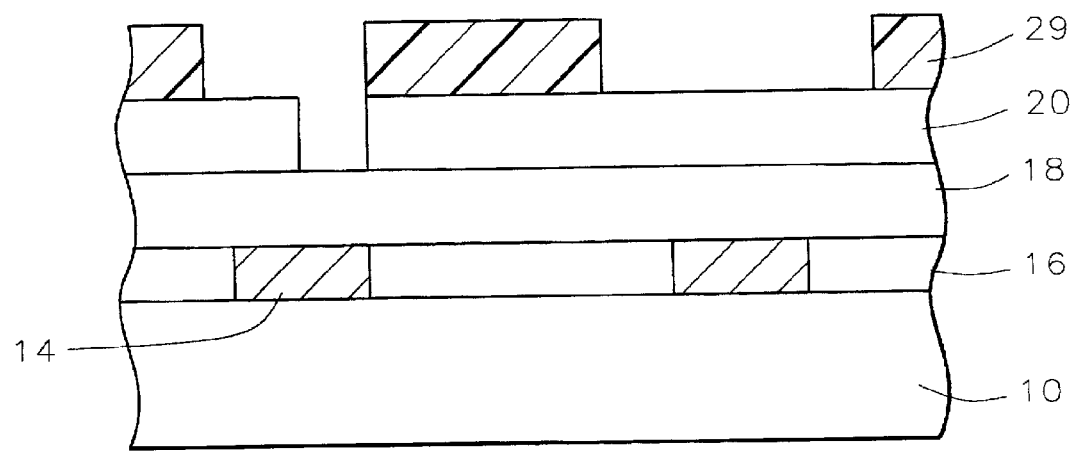

Referring now to FIG. 17, a second photoresist layer is coated over the second dielectric layer 20 and patterned to form the photoresist mask 29 having a trench pattern.

Figure 18:
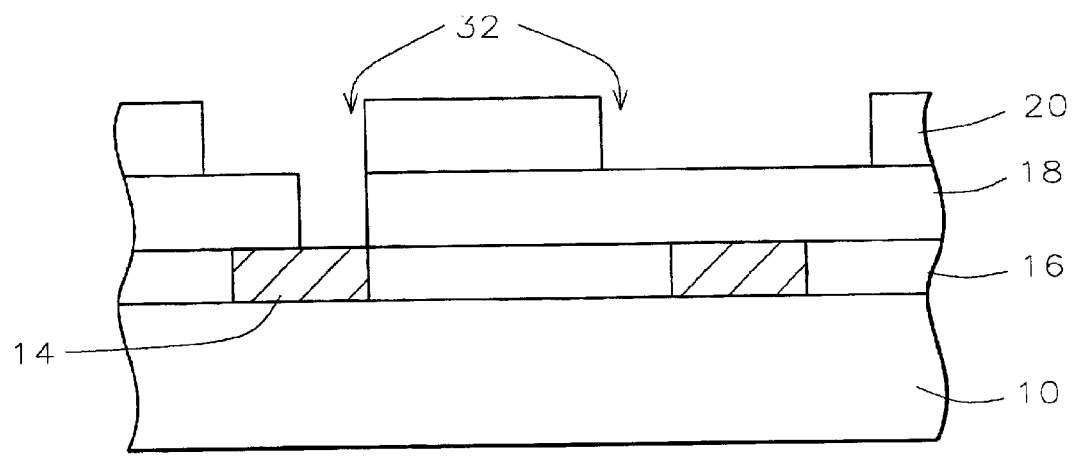

The trench and via patterns are etched simultaneously into the second dielectric layer 20 and the first dielectric layer 18, respectively, as shown in FIG. 18. Since the two dielectric layers comprise different materials, two etching recipes must be used, one for the organic material and another for the inorganic material.

The photoresist mask 29 is removed, leaving the completed dual damascene openings 32, shown in FIG. 18. The process of the invention has formed the dual damascene openings using a double layer of low dielectric constant materials. No high dielectric constant material was used as an etch stop. Therefore, low capacitance is maintained.

Figure 19:
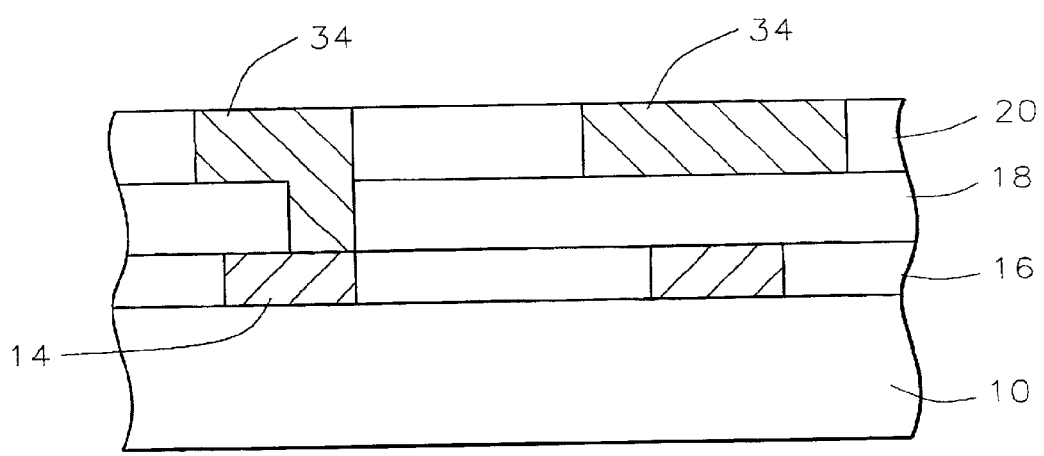

Processing continues as is conventional in the art to fill the damascene openings 32. For example, a barrier metal layer, not shown, is typically deposited over the third dielectric layer and within the openings. A metal layer, such as copper, is formed within the openings, such as by sputtering, electroless plating, or electroplating, for example. The excess metal may be planarized to complete the metal fill 34, as shown in FIG. 19.

The process of the present invention provides three simple and manufacturable dual damascene processes where only low dielectric constant materials are used. No high dielectric constant materials are required as etch stops. The process of the invention uses a novel double layer of low dielectric constant materials to form dual damascene openings in the manufacture of integrated circuits.

While the invention has been particularly shown and described with reference to the preferred embodiments thereof, it will be understood by those skilled in the art that various changes in form and details may be made without departing from the spirit and scope of the invention.

What is claimed is:

1. A method of forming dual damascene openings in the fabrication of an integrated circuit device comprising:

providing metal lines covered by an insulating layer overlying a semiconductor substrate;

depositing an organic dielectric layer overlying said insulating layer;

depositing an inorganic dielectric layer overlying said organic dielectric layer wherein no etch stop layer is formed between said organic dielectric layer and said inorganic dielectric layer;

etching a via pattern into said inorganic dielectric layer;

etching said via pattern into said organic dielectric layer using patterned said inorganic dielectric layer as a mask; and thereafter etching a trench pattern into said inorganic dielectric layer wherein said organic dielectric layer acts as an etch stop to complete said forming of said dual damascene openings in the fabrication of said integrated circuit device.

2. The method according to claim 1 further comprising forming semiconductor device structures including gate electrodes and source and drain regions in and on said semiconductor substrate wherein said metal lines overlie and contact said semiconductor device structures.

3. The method according to claim 1 wherein said organic dielectric layer comprises polyimides, hydrido organo polymer, polyphenylene polymers, poly(arylene) ethers, benzocyclobutene, methylsilsesquioxane, or organic polymers.

4. The method according to claim 1 wherein said inorganic dielectric layer comprises carbon-doped oxides, silicon oxide-based low-k films, flourinated silicate glass, carbon-doped flourinated silicate glass, nitrogen-doped flourinated silicate glass, trimethylsilane flourinated silicate glass, hydrogen silsesquioxane based materials flourinated silicate glass, or hydrogen silsesquioxane.

5. The method according to claim 1 further comprising filling said dual damascene openings with a metal layer.

6. A method of forming dual damascene openings in the fabrication of an integrated circuit device comprising:

providing metal lines covered by an insulating layer overlying a semiconductor substrate;

depositing an organic dielectric layer overlying said insulating layer;

depositing an inorganic dielectric layer overlying said organic dielectric layer wherein no etch stop layer is formed between said organic dielectric layer and said inorganic dielectric layer;

etching a trench pattern into said inorganic dielectric layer; and thereafter etching a via pattern into said organic dielectric layer through said trench pattern to complete said forming of said dual damascene openings in the fabrication of said integrated circuit device.

7. The method according to claim 6 further comprising forming semiconductor device structures including gate electrodes and source and drain regions in and on said semiconductor substrate wherein said metal lines overlie and contact said semiconductor device structures.

8. The method according to claim 6 wherein said organic dielectric layer comprises polyimides, hydrido siloxane organo polymer, polyphenylene polymers poly(arylene) ethers, benzocyclobutene, methylsilsesquioxane, or organic polymers.

9. The method according to claim 6 wherein said inorganic dielectric layer comprises carbon-doped oxides, silicon oxide-based low-k films, flourinated silicate glass, carbon-doped flourinated silicate glass, nitrogen-doped flourinated silicate glass, trimethylsilane flourinated silicate glass, hydrogen silsesquioxane based materials flourinated silicate glass, or hydrogen silsesquioxane.

10. The method according to claim 6 further comprising filling said dual damascene openings with a metal layer.

* * * * *

UNITED STATES PATENT AND TRADEMARK OFFICE
CERTIFICATE OF CORRECTION

PATENT NO. : 6,803,314 B2
DATED : October 12, 2004
INVENTOR(S) : Shyue Fong Quek et al.

It is certified that error appears in the above-identified patent and that said Letters Patent is hereby corrected as shown below:

Title page,
Item [75], Inventors, delete "Sang Yee Long" and replace with -- Sang Yees Loong --.

Signed and Sealed this

First Day of February, 2005

JON W. DUDAS
*Director of the United States Patent and Trademark Office*